US006917204B2

(12) United States Patent
Mitrovic et al.

(10) Patent No.: US 6,917,204 B2
(45) Date of Patent: Jul. 12, 2005

(54) ADDITION OF POWER AT SELECTED HARMONICS OF PLASMA PROCESSOR DRIVE FREQUENCY

(75) Inventors: Andrej S. Mitrovic, Phoenix, AZ (US); Jovan Jevtic, Milwaukee, WI (US); Richard Parsons, Phoenix, AZ (US); Murray D. Sirkis, Tempe, AZ (US)

(73) Assignee: Tokyo Electron Limited, Tokyo (JP)

( * ) Notice: Subject to any disclaimer, the term of this patent is extended or adjusted under 35 U.S.C. 154(b) by 43 days.

(21) Appl. No.: 10/612,824

(22) Filed: Jul. 3, 2003

(65) Prior Publication Data

US 2004/0035837 A1 Feb. 26, 2004

Related U.S. Application Data

(63) Continuation of application No. PCT/US01/47487, filed on Dec. 17, 2001.
(60) Provisional application No. 60/259,861, filed on Jan. 8, 2001.

(51) Int. Cl.[7] .......................... G01N 27/62; G01R 23/20; H05H 1/24; H01L 21/00
(52) U.S. Cl. ....................... 324/464; 324/622; 324/623; 427/569; 438/9
(58) Field of Search .............................. 324/451, 464, 324/713, 716–718, 71.5, 622, 623; 315/111.21, 111.31; 438/9, 10; 118/723; 427/569

(56) References Cited

U.S. PATENT DOCUMENTS

| | | | | |
|---|---|---|---|---|
| 5,325,019 A | * | 6/1994 | Miller et al. ............. | 315/111.21 |
| 5,698,062 A | * | 12/1997 | Sakamoto et al. ...... | 156/345.44 |
| 5,705,931 A | * | 1/1998 | Klick ......................... | 324/464 |
| 5,808,415 A | * | 9/1998 | Hopkins ................ | 315/111.21 |
| 5,844,369 A | * | 12/1998 | Yoshizako et al. ...... | 315/111.21 |
| 5,849,372 A | * | 12/1998 | Annaratone et al. ........ | 427/569 |
| 6,089,181 A | * | 7/2000 | Suemasa et al. ......... | 118/723 E |

* cited by examiner

*Primary Examiner*—Anjan K. Deb
(74) *Attorney, Agent, or Firm*—Pillsbury Winthrop LLP (57) ABSTRACT

A method for controlling the non-uniformities of plasma-processed semiconductor wafers by supplying the plasma with two electrical signals: a primary electrical signal that is used to excite the plasma, and a supplemental electrical signal. The supplemental signal may be composed of a plurality of electrical signals, each with a frequency harmonic to that of the primary signal. The phase of the supplemental signal is controlled with respect to the phase of the primary signal. By adjusting the parameters of the supplemental signal with respect to the primary signal, the user can control the parameters of the resultant plasma and, therefore, control the non-uniformities induced in the semiconductor wafer.

17 Claims, 6 Drawing Sheets

ADDITION OF POWER AT SELECTED HARMONICS OF PLASMA PROCESSOR DRIVE FREQUENCY

FIELD OF THE INVENTION

This is a Continuation of International Application No. PCT/US01/47487, which was filed on Dec. 17, 2001, which, in turn, claims the benefit of U.S. provisional application No. 60/259,861, which was filed Jan. 8, 2001, the contents of both of which are incorporated herein in their entirety.

BACKGROUND OF THE INVENTION

In the processing of semiconductor wafers, such as silicon wafers, many techniques are known for modifying the surface of the wafer. These surface modifications may involve, for example, adding material, as in the case of a metal deposited on the wafer, or removing material, as is done during etching.

A particularly popular set of techniques for adding or removing material from the surface of a silicon wafer involves the use of plasma. A plasma is a gas (or gas mixture) which is energized so that it partially decomposes and forms a mixture of charged and uncharged particles. Plasmas may be generated by the application of an alternating current electrical signal (AC current) to the gas mixture. This generating current typically has a high frequency, usually in the radio frequency (RF) range, and is applied to the gas mixture by an electrode placed in the gas-containing vessel. The frequency of the electrical signal applied to the gas is called the RF drive frequency of the plasma processing system.

It has long been recognized in the art that the electrical response of plasmas generated by the application of AC power is nonlinear, that is, at typical applied power levels, the impedance (resistance to electrical current flow) of the plasma is not directly proportional to the applied voltage. The nonlinear response of the plasma to the applied power results in the generation of harmonic power frequencies in the plasma. Harmonic power frequencies are electrical signals with frequencies that are some integral multiple of the RF drive frequency of the plasma processing system. In a typical plasma processing system, hundreds of watts of power may be associated with harmonic power frequencies related to the RF drive frequency. These harmonics lead to a plasma that is not uniform in its characteristics.

Figure 1:
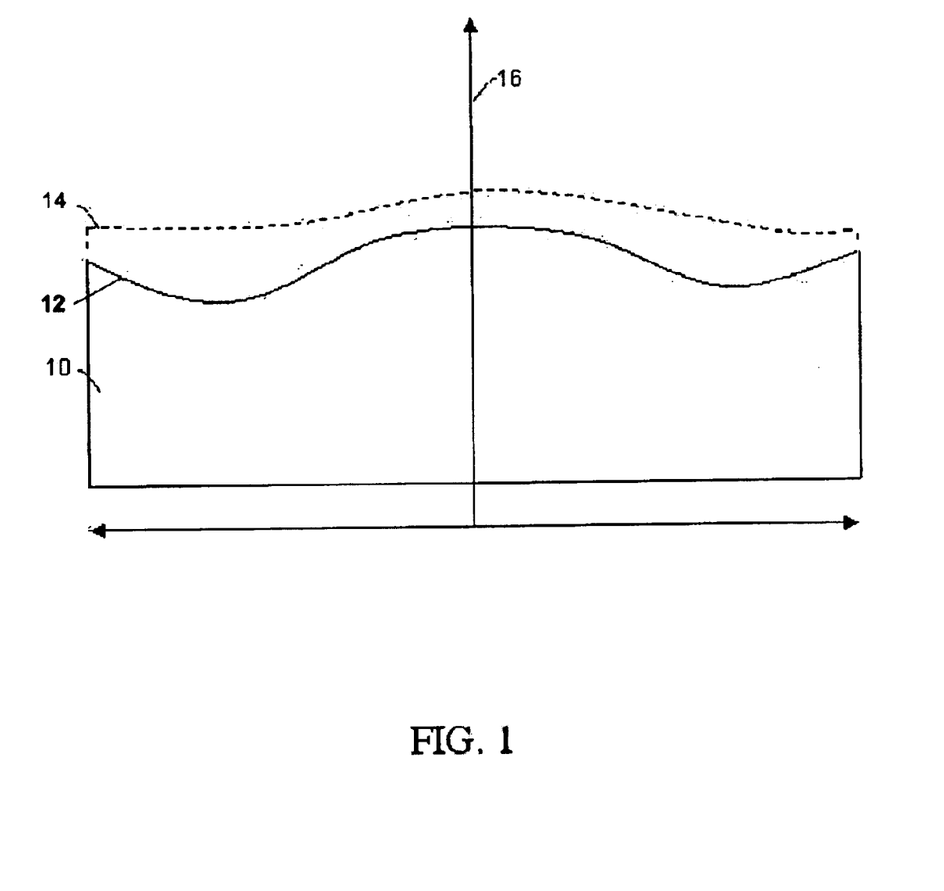
FIG. 1 is an illustration showing a non-uniform plasma processed substrate and the relationship between the substrate's uniformity and the distance from the substrate's center.

When a non-uniform plasma is applied to a silicon wafer, for example, to etch the wafer, the non-uniform plasma results in a non-uniform wafer etch whose characteristics vary with the distance from the plasma electrode. FIG. 1 is an illustration depicting the non-uniformity of a plasma-etched wafer as a function of the distance from the center 16 of the wafer. In FIG. 1, the surface profile 12 of the wafer 10 is non-uniform and roughly sinusoidal. This non-uniform wafer processing may be undesirable, and considerable effort has been expended in attempts to control the power harmonics present in the plasma to produce a more uniform plasma, and thus a more uniformly processed wafer.

Processes to control the power harmonics present in a plasma are predicated on the wave nature of the AC electrical signal used to excite the plasma. In addition to the frequency of the AC signal described above, the signal has an amplitude, or strength, and a phase, or timing difference relative to other waves. The combination of several AC electrical signals of different frequencies, amplitudes or phases is governed by the principle of superposition. This principle states that the sum of two waves of differing amplitudes results in a wave that, in general, has an amplitude different from either of its addends. When waves are to be added, differences in their frequencies, phases or amplitudes can change the characteristics of the resultant wave. Thus, if AC electrical signals with different phases and frequencies are used in combination in a plasma processing system, the resulting excitatory waveform could demonstrate constructive or destructive interference.

Previous attempts to control the non-uniformity present in a plasma have included the use of a plurality of RF drive electrodes or alternately, a plurality of segments of a segmented electrode. The plurality of electrodes or segments are excited at a single RF frequency by means of a single RF oscillator and a plurality of separate RF amplifiers and phase shifters. An example of this technique is seen in U.S. Pat. No. 5,932,116 (Matsumoto).

Another approach to controlling the non-uniformity present in a plasma is found in U.S. Pat. No. 6,043,607. In this approach, a plurality of RF sources operating at a corresponding plurality of RF frequencies are used to generate a complex power waveform and excite a plasma within a semiconductor processing system. In the above-cited reference, the frequencies in the complex excitation waveform are not precisely controlled, so there are constantly varying phase differences between the plurality of RF sources.

Each of these previous attempts has focused on attenuating or accentuating the harmonic power frequencies present in a non-uniform plasma without independently controlling both the phase and amplitude of the input power at each selected harmonic frequency. In FIG. 1, the dotted-line surface profile 14 of the wafer 10 illustrates a potential advantage of a plasma processing system in which both phase and amplitude are controlled at each selected harmonic frequency. The non-uniform surface perturbations of the wafer 10 have been greatly attenuated in the dotted-line surface profile 14, resulting in a more uniform wafer.

SUMMARY OF THE INVENTION

The present invention provides a method for controlling the electrical signals present in a plasma by providing two signals to a plasma drive electrode: a radio frequency signal and a supplemental signal. The supplemental signal is controlled separately from the radio frequency signal and is comprised of at least one signal harmonic to the fundamental frequency and having a controlled phase relationship with the fundamental frequency of the radio frequency signal. Likewise, a plurality of supplemental signals, each at a frequency harmonic to the fundamental frequency, may be employed.

The method includes a means for determining the parameters of any electrical signals present in the plasma and correlating the parameters of these signals with those of the radio frequency signal and the supplemental signal(s). The two signals can then be adjusted to provide a time-independent phase difference therebetween. In one embodiment, at least the first, second and third harmonic frequencies of the radio frequency signal can be controlled. The parameters of the radio frequency signal and the supplemental signal can then be correlated with the electrical signals in the plasma to change the parameters of the plasma. The method is particularly suited to controlling plasma parameters such as: the etch rate and deposition rate of the plasma, the uniformity of the etch and deposition rates, the selectivity of the etch of one material relative to the etch of another material, the uniformity of the selectivity, feature profile (or anisotropy), the uniformity of the feature profile, the deposited film stress, and the uniformity of the deposited film stress. The method may also be suited to controlling other parameters as well.

The present invention has one embodiment in a device that has three main components: a means for producing an electrical signal with a fundamental frequency, a means for producing a separately controlled supplemental electrical signal with a frequency harmonic to and in phase with the first electrical signal, and a plasma drive electrode driven by the electrical signal and the supplemental electrical signal. The means for producing the electrical signals may include signal generators as well as other means known in the art.

Other objects, features, and advantages of the present invention will become apparent from the following detailed description, the accompanying drawings and the appended claims.

DETAILED DESCRIPTION OF THE EMBODIMENTS

Figure 2:
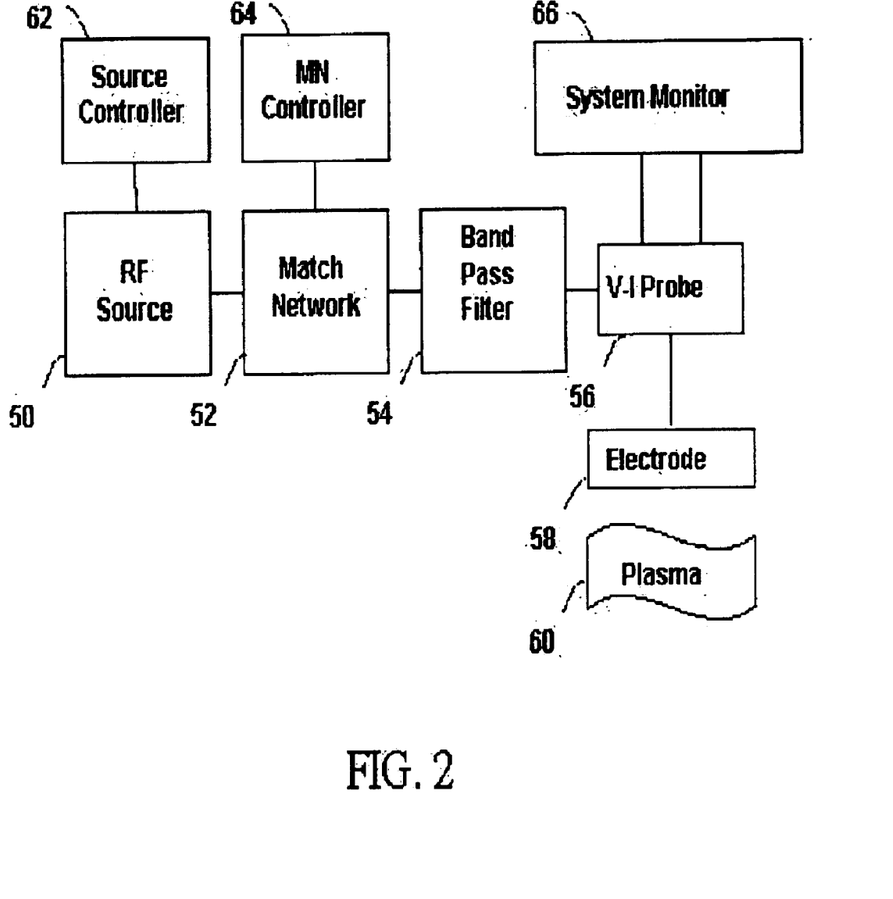
FIG. 2 is a block diagram of the basic components of a plasma processing system.

Referring now more particularly to the drawings, FIG. 2 shows a generalized block diagram of the most basic components of a plasma processing system. An electrical signal with a frequency in the radio frequency (RF) range is generated by RF source 50. RF source 50 is controlled by source controller 62. Match network 52 optimizes the transfer of RF power from RF source 50 to plasma generating electrode 58, and is controlled by match network controller 64. Disposed between match network 52 and plasma generating electrode 58 are two components: a band pass filter 54 and a V-I probe 56. Band pass filter 54 protects match network 52 from the electrical signals present in the plasma 60. V-I probe 56 records the properties of the RF signals present in the system and provides those properties to a system monitoring component, depicted generally in this example as 66.

Figure 3:
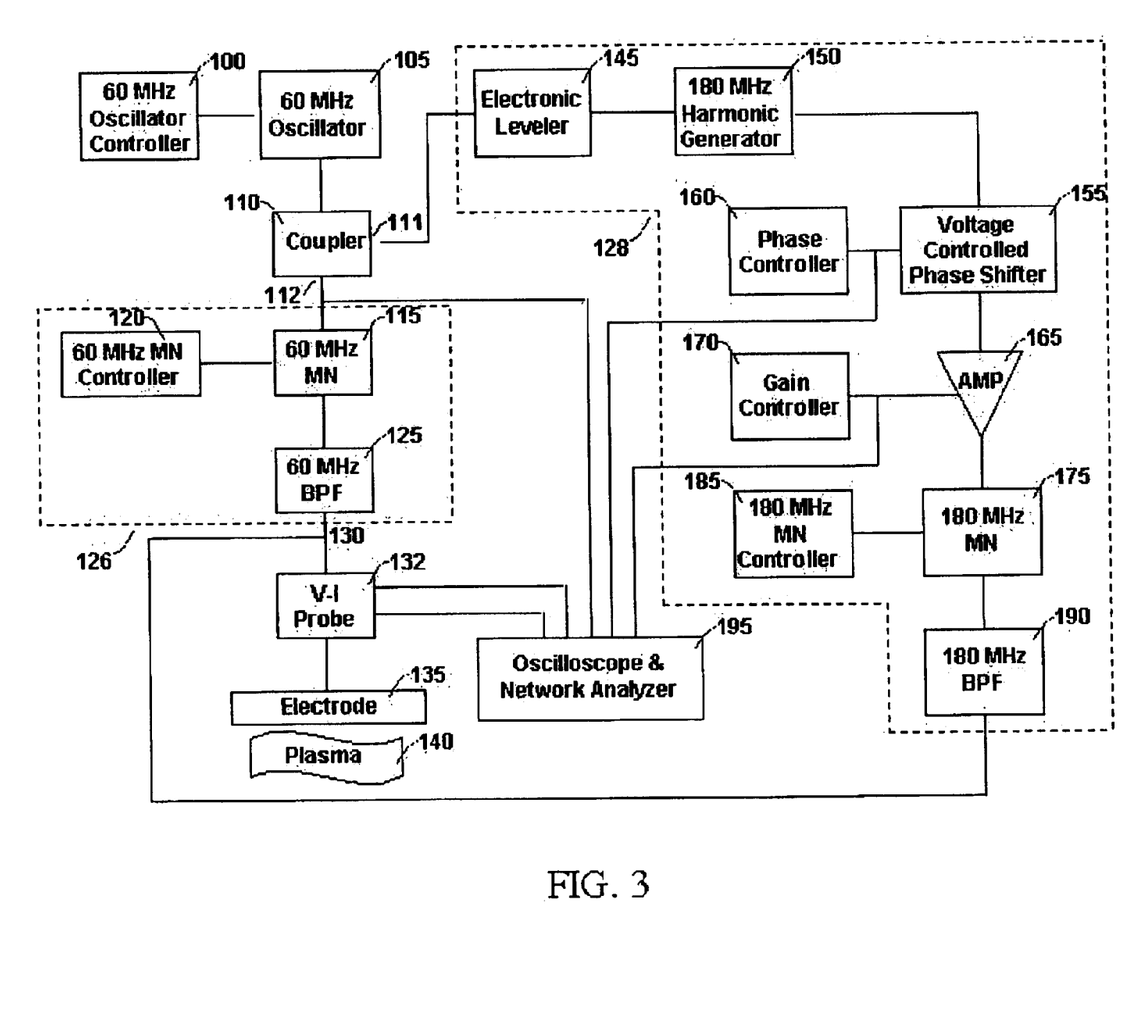
FIG. 3 is a block diagram of an exemplary embodiment of an apparatus by which this invention may be implemented.

FIG. 3 shows a block diagram of an apparatus by means of which this invention may be implemented. The output amplitude of 60 MHz RF source 105 is controlled by 60 MHz RF source controller 100 which is connected by either mechanical or electrical means thereto. A frequency of 60 MHz is used here for the purpose of description, but another frequency, either higher or lower, might be used. The output power of 60 MHz RF source 105 is typically in the range from 1 to 5 kilowatts. The 60 MHz RF source 105 is electrically connected to RF coupler 110. RF coupler 110 has two output terminals. Almost all of the power incident on RF coupler 110 emerges from it at the main output terminal 112, which is electrically connected to 60 MHz match network 115. A small fraction of the incident power, determined by the coupling factor of RF coupler 110, flows through the lower power output terminal 111 and is directed to voltage amplitude leveler 145. The output of the lower power output terminal 111 to the voltage amplitude leveler 145 will subsequently be considered below. The coupling factor of RF coupler 110 is typically in the range from −65 to −50 dB. The 60 MHz match network 115 optimizes the transfer of RF power from 60 MHz RF oscillator 105 to plasma 140. Automatic control of 60 MHz match network 115 is provided by 60 MHz match network controller 120 by means that are well understood by contemporary practitioners of related art. The output of 60 MHz match network 115 is electrically connected to 60 MHz band pass filter 125 which, in turn, is electrically connected to plasma excitation electrode 135 by means of RF transmission line 130. The purpose of 60 MHz band pass filter 125 is to prevent RF power due to the nonlinear electrical properties of plasma 140 and consequent harmonic generation therein from adversely affecting 60 MHz match network 115. The pathway between the main output terminal 112 of the coupler 110 and the V-I probe 132 constitutes the first circuit branch 126 of the device. V-I probe 132 is located in RF transmission line 130 between 60 MHz band pass filter 125 and plasma excitation electrode 135. V-I probe 132 facilitates measurement of the voltage and current in RF transmission line 130 at the location of V-I probe 132. The outputs of V-I probe 132 are electrically transmitted to oscilloscope and network analyzer 185, where they may be used for analysis and/or control of system operation. The use of a V-I probe as intended herein is well-known. See, for example U.S. Pat. No. 5,325,019.

Return now to RF coupler 110; the power level output by the coupler's lower power terminal 111 is determined by its coupling factor. The pathway between the lower power output terminal 111 of the coupler 110 and the V-I probe 132 constitutes the second circuit branch 128 of the device. Power emerges from the lower power terminal 111 and is electrically directed to the input terminal of automatic voltage amplitude leveler 145, which electronically assures that the 60 MHz RF voltage amplitude of the signal emerging therefrom is virtually independent of the amplitude of the input signal thereto for all input signals of practical interest for the purpose of this invention. This 60 MHz RF signal is electrically directed to harmonic generator 150 or to a plurality of harmonic generators 150a, 150b, ..., 150n. It should be readily apparent that the discussion that follows is applicable to additional harmonic generators simultaneously producing other harmonics (e.g., the fifth) of the signal originating from 60 MHz RF source 105 or to a single harmonic generator 150 that simultaneously provides at a plurality of output terminals a plurality of harmonics.

In the discussion that follows, a single harmonic generator 150 generates the third harmonic of the signal originating from 60 MHz RF source 105. That is, the frequency of the harmonic signal is 180 MHz. The output of harmonic generator 150 is electrically connected to RF voltage-controlled phase shifter 155, which is, in turn, electrically connected to RF phase controller 160. RF voltage-controlled phase shifter permits the phase of the RF harmonic signal to be adjusted with respect to the phase of the 60 MHz RF signal. This adjustment of the relative phase is meaningful because the harmonic RF signal is phase locked to the fundamental RF signal by virtue of the means by which it is produced. The preferred range of phase adjustment for the harmonic RF signal (i.e., the 180 MHz signal in the example discussed here) is ±180° or ±π radians.

The output terminal of RF voltage-controlled phase shifter 155 is electrically connected to the input terminal of 180 MHz voltage-controlled amplifier 165. Amplifier gain controller 170 controls the voltage gain of 180 MHz voltage-controlled amplifier 165 to which it is connected by electrical or mechanical means. The output terminal of 180 MHz voltage-controlled amplifier 165 is electrically connected to the input terminal of 180 MHz match network 175. The 180 MHz match network 175 optimizes the transfer of RF power from 180 MHz RF voltage-controlled amplifier 165 to plasma 140. Automatic control of 180 MHz match network 175 is provided by 180 MHz match network controller 185 by means that are well understood by contemporary practitioners of related art. The output of 180 MHz match network 175 is electrically connected to 180 MHz band pass filter 190. The purpose of 180 MHz band pass filter 190 is to prevent RF power at any frequencies other than 180 MHz from adversely affecting 180 MHz match network 175. The output terminal of 180 MHz band pass filter 190 is electrically connected to RF transmission line 130 between 60 MHz band pass filter 125 and V-I probe 132. In this way RF power at both the fundamental RF frequency (60 MHz) and the selected harmonic frequency (180 MHz in this example) is directed to plasma excitation electrode 135.

Figure 4:
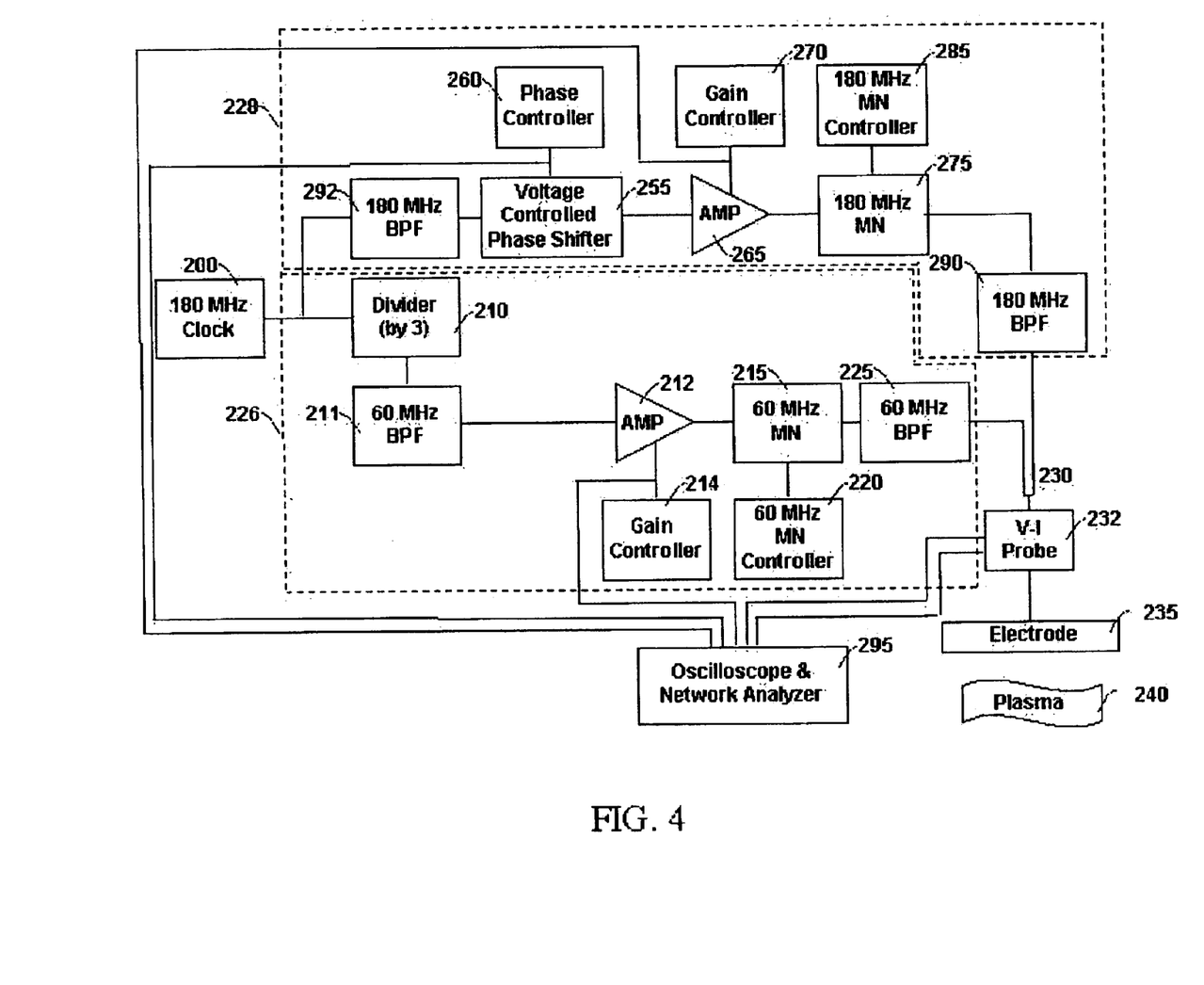
FIG. 4 is a block diagram of a second exemplary embodiment of an apparatus by which this invention may be implemented.

Oscilloscope and network analyzer 195 is used to monitor and facilitate control of (a) the output power of 60 MHz RF source 105, (b) the RF voltage as measured by V-I probe 132, (c) the RF current as measured by V-I probe 132, (d) the mechanical or electrical output of RF phase controller 160, (e) amplifier gain controller 170. Additional inputs to oscilloscope and network analyzer 195 may be added to permit measurement and control of other parameters. Still another embodiment of the invention is depicted in FIG. 4. In this embodiment, a harmonic generator is unnecessary. In FIG. 4 it is assumed that the lower frequency signal is to be 60 MHz and the third harmonic (i.e., 180 MHz) of that lower frequency is also to be used, just as in the embodiment of FIG. 3. Refer now to FIG. 4. Clock 200 produces a 180 MHz square wave. Clock 200 is electrically connected to 180 MHz band pass filter 292, the output of which is a 180 MHz sinusoid. Clock 200 is also electrically connected to frequency divider 210, which in this example, converts the 180 MHz square wave to a 60 MHz square wave. Frequency divider 210 is electrically connected to 60 MHz band pass filter 211, the output of which is a 60 MHz sinusoid. The description that immediately follows deals with the subsequent processing of the 60 MHz sinusoidal signal; the processing of the 180 MHz sinusoidal signal will be considered later. The pathway between the 180 MHz clock 200 and the V-I probe 232 as shown in the lower portion of FIG. 4 constitutes the first circuit branch 226 of the device. The pathway between the 180 MHz clock 200 and the V-I probe as shown in the upper portion of FIG. 4 constitutes the second circuit branch 228 of the device.

The output of 60 MHz band pass filter 211 is electrically connected to the signal input terminal of voltage-controlled amplifier 212. Amplifier gain controller 214 controls the voltage gain of 60 MHz voltage-controlled amplifier 212, to which it is connected, by electrical or mechanical means. The output terminal of 60 MHz voltage-controlled amplifier 212 is electrically connected to the input terminal of 60 MHz match network 215. The 60 MHz match network 215 optimizes the transfer of RF power from 60 MHz RF voltage-controlled amplifier 212 to plasma 240. Automatic control of 60 MHz match network 215 is provided by 60 MHz match network controller 220 by means that are well understood by contemporary practitioners of related art. The output of 60 MHz match network 215 is electrically connected to 60 MHz band pass filter 225. The purpose of 60 MHz band pass filter 225 is to prevent RF power at the 180 MHz RF harmonic frequency, specifically, but also at other harmonic frequencies from adversely affecting 60 MHz match network 215. The output terminal of 60 MHz band pass filter 225 is electrically connected by means of RF transmission line 230 to V-I probe 232. V-I probe 232 is located in RF transmission line 230 between 60 MHz band pass filter 225 and plasma excitation electrode 235. V-I probe 232 facilitates measurement of the voltage and current in RF transmission line 230 at the location of V-I probe 232. The voltage and current sensing outputs of V-I probe 232 are electrically connected to oscilloscope and network analyzer 295, where they may be used for analysis and/or control of system operation. The power output terminal of V-I probe 232 is electrically connected to plasma drive electrode 235, which excites plasma 240.

The output of 180 MHz band pass filter 292 is electrically connected to RF voltage-controlled phase shifter 255, which is, in turn, electrically connected to RF phase controller 260. RF voltage-controlled phase shifter 255 permits the phase of the 180 MHz signal to be adjusted with respect to the phase of the 60 MHz RF signal. This adjustment of the relative phase is meaningful because the harmonic RF signal is phase locked to the fundamental RF signal by virtue of the means by which it is produced. The preferred range of phase adjustment for the 180 MHz signal is ±180° or ±π radians.

The output terminal of RF voltage-controlled phase shifter 255 is electrically connected to the input terminal of 180 MHz voltage-controlled amplifier 265. Amplifier gain controller 270 controls the voltage gain of 180 MHz voltage-controlled amplifier 265 to which it is connected by electrical or mechanical means. The output terminal of 180 MHz voltage-controlled amplifier 265 is electrically connected to the input terminal of 180 MHz match network 275. The 180 MHz match network 275 optimizes the transfer of RF power from 180 MHz RF voltage-controlled amplifier 265 to plasma 240. Automatic control of 180 MHz match network 275 is provided by 180 MHz match network controller 285 by means that are well understood by contemporary practitioners of related art. The output of 180 MHz match network 275 is electrically connected to 180 MHz band pass filter 290. The purpose of 180 MHz band pass filter 290 is to prevent RF power at the frequencies other than 180 MHz from adversely affecting 180 MHz match network 275. The output terminal of 180 MHz band pass filter 290 is electrically connected to RF transmission line 130 between 60 MHz band pass filter 215 and V-I probe 232. In this way RF power at both the lower RF frequency (60 MHz) and the selected harmonic frequency (180 MHz in this example) is directed to plasma excitation electrode 235.

Oscilloscope and network analyzer 295 is used to monitor and facilitate control of (a) the output power of 60 MHz RF source at the gain controller 214, (b) the RF voltage as measured by V-I probe 232, (c) the RF current as measured by V-I probe 232, (d) the mechanical or electrical output of RF phase controller 260, (e) the mechanical or electrical output of amplifier gain controller 270. Additional inputs to oscilloscope and network analyzer 295 may be added to permit measurement and control of other parameters.

Figure 5:
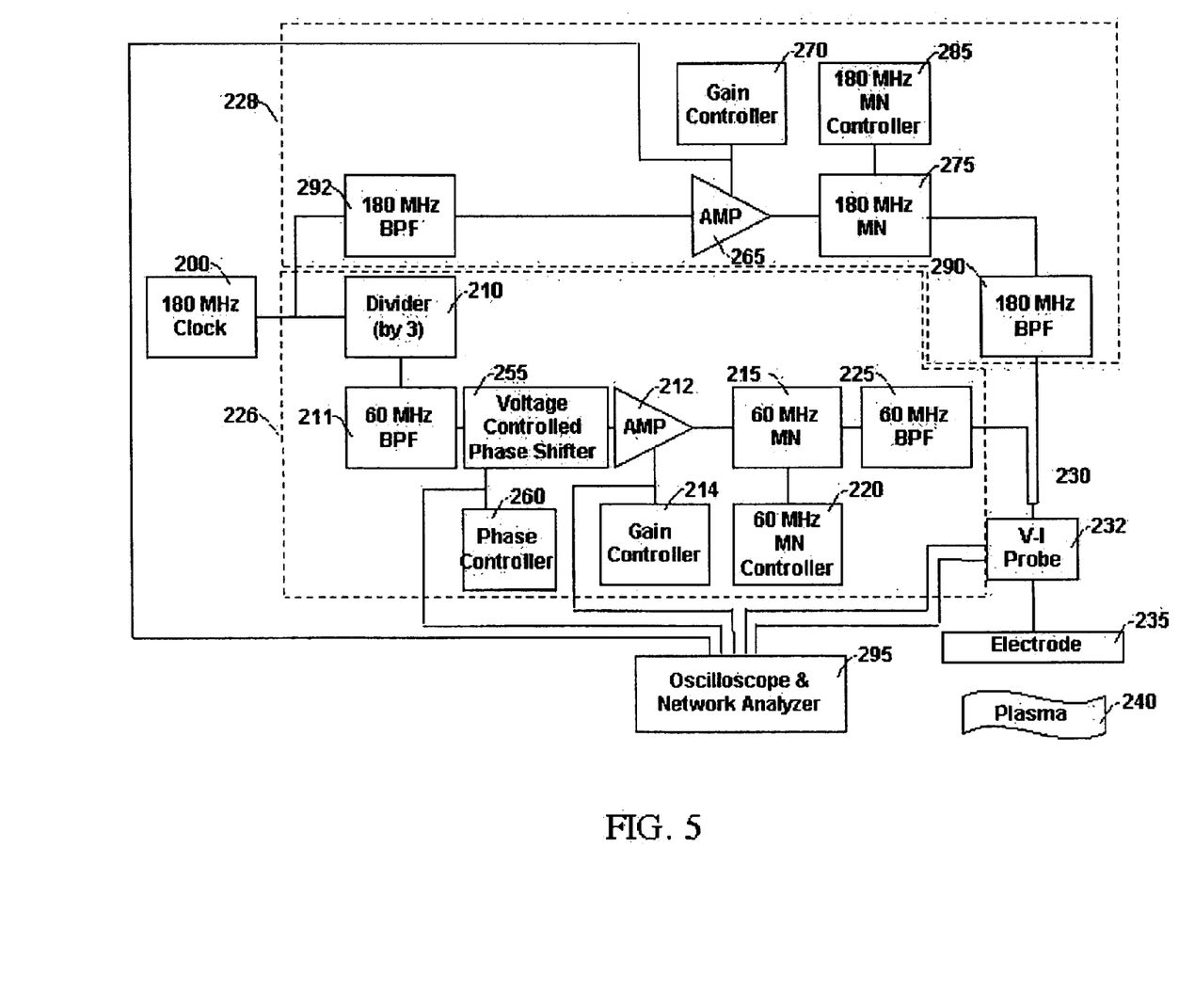
FIG. 5 is a block diagram of a third exemplary embodiment of an apparatus by which this invention may be implemented.

Still another embodiment is shown in FIG. 5. This embodiment differs from the embodiment of FIG. 4 only in the location of voltage-controlled phase shifter 255 and its associated phase controller 260. Whereas these elements are located in the 180 MHz branch 228 of the embodiment of FIG. 4, they are located in the 60 MHz branch 226 in the embodiment of FIG. 5. If only two frequencies are used, either configuration may be used to advantage. However if more than two frequencies are used, a logical extension of the embodiment depicted in FIG. 4 may be used as described below.

In some circumstances, it may be desirable to use RF power at a lowest frequency; e.g., 60 MHz, and RF power at two or more harmonics of the lowest frequency. For example, it may be advantageous to use RF power at 120 MHz and 180 MHz in addition to RF power at 60 MHz. In such a situation the embodiment shown in FIG. 6 may be used. This embodiment functions in essentially the same way as the embodiment shown in FIG. 4. Note, however, that a 120 MHz RF path 229 has been added, and that this 120 MHz RF path 229 comprises elements that correspond one-to-one with elements of the 180 MHz RF path 228. The clock frequency may be chosen to be the lowest frequency that is divisible without a remainder by every one of the frequencies of interest. In the example considered here, the clock frequency is therefore 360 MHz. Note that in FIG. 6, the elements of the 120 MHz RF path 229 are denoted by a number and a subscript a; the corresponding elements of the 180 MHz RF 228 path are denoted by the same number and a subscript b. Because of the similarity of the operation of the embodiment of FIG. 5 and the embodiment of FIG. 6, no further discussion of FIG. 6 will be included.

Figure 6:
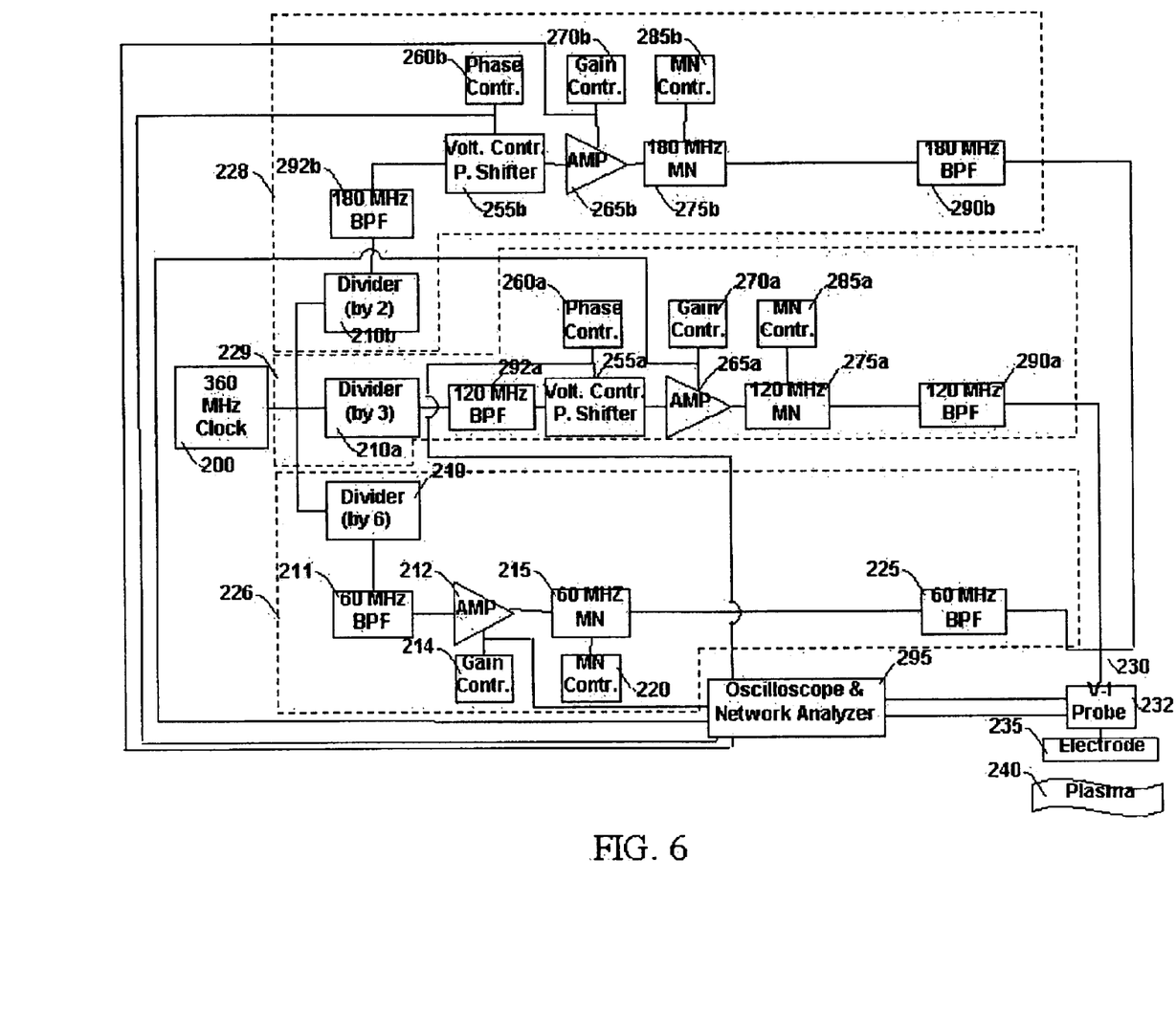
FIG. 6 is a block diagram of a fourth exemplary embodiment of an apparatus by which this invention may be implemented.

It should be apparent to the reader that the embodiment of FIG. 6 may be extrapolated to include more than three frequencies. For example, one could use 60 MHz, 120 MHz, 180 MHz, and 240 MHz. In such a case, a branch for each of the three higher frequencies would, of course, be required. The lowest suitable clock frequency would be 720 MHz, and division of the clock frequency by 3, 4, 6, and 12 for the several lower frequency branches would be necessary.

Return now to the assertion made above that if more than two frequencies are to be used, an extension of the embodiment of FIG. 4 is preferable to an extension of the embodiment of FIG. 5. The reason for this statement is that the phase of each of the higher RF frequencies is independently controlled with respect to the lowest RF frequency, which is the frequency at which most of the RF power is typically delivered to the plasma 240. In an extension of the embodiment of FIG. 5, a change in the phase of the lowest frequency RF signal (60 MHz in the examples considered herein) changes the phase of all of the other RF frequencies with respect to the lowest RF frequency signal. Consequently, optimum adjustment of all of the phase relationships may be more difficult to achieve than with the embodiment of FIG. 4 in which the phase of each higher RF frequency component can be individually adjusted with respect to the phase of the lowest RF frequency.

While the principles of the invention have been made clear in the illustrative embodiments set forth above, it will be apparent to those skilled in the art that various modifications may be made to the structure, arrangement, proportion, elements, materials, and components used in the practice of the invention.

For example, an entirely automatic embodiment of the invention has not been described, but it is entirely reasonable to suppose that such an embodiment will be possible after a data base that correlates V-I probe outputs to process uniformity will have been established.

It will thus be seen that the objects of this invention have been fully and effectively accomplished. It will be realized, however, that the foregoing preferred specific embodiments have been shown and described for the purpose of illustrating the functional and structural principles of this invention and are subject to change without departure from such principles. Therefore, this invention includes all modifications encompassed within the spirit of the following claims.

What is claimed:

1. A method comprising:
   providing a radio frequency electrical signal at a fundamental frequency to a plasma drive electrode; and
   providing a supplemental signal to the plasma drive electrode, the supplemental signal being controlled separately from the radio frequency electrical signal at a frequency harmonic to the fundamental frequency and having a controlled phase relationship with the fundamental frequency.

2. The method of claim 1, wherein the supplemental signal comprises a plurality of signals, each of the plurality of signals being at a frequency harmonic to the fundamental frequency and in phase with the fundamental frequency.

3. The method of claim 2, wherein the plurality of signals are at frequencies selected from the group consisting of: first harmonic, second harmonic and third harmonic of the fundamental frequency.

4. The method of claim 1, wherein a plasma produced by the plasma drive electrode in a plasma generator produces an etch rate which is more uniform than an etch rate produced by the radio frequency electrical signal without the supplemental signal.

5. The method of claim 1, further comprising:
   measuring parameters of the radio frequency electrical signal and the supplemental signal; and
   controlling the radio frequency signal and the supplemental signal based on the measured parameters.

6. The method of claim 5, further comprising:
   determining a phase difference between a drive frequency generated within a plasma produced by the plasma drive electrode and the fundamental frequency; and
   controlling the radio frequency signal and the supplemental signal to produce a time-independent phase difference.

7. The method of claim 6, wherein the parameters of the plasma are selected from the group consisting of: etch rate, deposition rate, uniformity of the etch or deposition rate, selectivity of the etch of one material relative to the etch of another material, the uniformity of the selectivity, feature profile (or anisotropy), the uniformity of the feature profile, deposited film stress, and the uniformity of the deposited film stress.

8. The method of claim 5, further comprising:
   correlating the measured parameters with parameters of a plasma produced by the plasma drive electrode; and
   controlling the radio frequency signal and the supplemental signal based on desired values for the parameters of the plasma.

9. A device comprising:
   means for producing an electrical signal having a fundamental frequency;
   means for producing a separately controlled supplemental electrical signal having a frequency which is a harmonic of the fundamental frequency and which is in phase with the electrical signal; and
   a plasma drive electrode,
   wherein said plasma drive electrode is driven by the electrical signal and the supplemental electrical signal.

10. A device comprising:
    a signal generator which produces an electrical signal having a fundamental frequency;

a supplemental signal generator which produces a supplemental signal having a frequency which is a harmonic of the fundamental frequency and which is in phase with the electrical signal; and a plasma drive electrode, wherein said plasma drive electrode is driven by the electrical signal and the supplemental electrical signal.

11. The device of claim 10, further comprising:

an oscillator, controlled by an oscillator controller, included in the signal generator;

a harmonic generator included in the supplemental signal generator; and a phase shifter controlled by a phase controller to adjust the phase of the supplemental signal relative to the fundamental frequency electrical signal.

12. The device of claim 11, further comprising:

a first circuit branch with a first match network having a frequency compatible with the fundamental frequency signal;

a second circuit branch with a second match network having a frequency compatible with the supplemental signal, through which the supplemental signal flows;

an amplifier circuit disposed in the second circuit branch to amplify the supplemental signal;

a coupler, at which power from the oscillator is sent into the second circuit branch for harmonic generation;

the phase shifter disposed in the second circuit branch for controlling the phase of the supplemental signal relative to the fundamental frequency electrical signal;

a combination node, disposed between respective ends of the first and second circuit branches and the plasma electrode at which the fundamental frequency signal and the supplemental signal are combined into one signal;

a voltage-current probe disposed between the combination node and the plasma electrode to measure the properties of the combined signal; and a system monitor in electrical communication with at least one branch of the device to monitor the device.

13. The device of claim 10, further comprising:

a clock having a frequency that is an integral multiple of the fundamental frequency of the radio frequency electrical signal; and a divider circuit to produce the fundamental frequency electrical signal and the supplemental signal from the signal provided by the clock.

14. The device of claim 13, further comprising:

a first circuit branch with a first match network having a frequency compatible with that of the fundamental frequency electrical signal;

a second circuit branch with a second match network having a frequency compatible with that of the supplemental signal;

a phase shifter controlled by a phase controller disposed in the second circuit branch to control the phase of the supplemental signal relative to the fundamental frequency electrical signal;

a first amplifier circuit to amplify the fundamental frequency electrical signal;

a second amplifier circuit to amplify the supplemental signal;

a combination node, disposed between respective ends of the first and second circuit branches and the plasma electrode at which the fundamental frequency signal and the supplemental signal are combined into one signal;

a voltage-current probe disposed between the combination node and the plasma electrode to measure the properties of the combined signal; and a system monitor in electrical communication with at least one branch of the device to monitor the device.

15. The device of claim 13, further comprising:

a first circuit branch with a first match network having a frequency compatible with that of the fundamental frequency signal;

a second circuit branch with a second match network having a frequency compatible with that of the supplemental signal;

a phase shifter controlled by a phase controller disposed in the first circuit branch to control the phase of the supplemental signal relative to the fundamental frequency electrical signal;

a first amplifier circuit to amplify the fundamental frequency electrical signal;

a second amplifier circuit to amplify the supplemental signal;

a combination node, disposed between respective ends of the first and second circuit branches and the plasma electrode at which the fundamental frequency signal and the supplemental signal are combined into one signal;

a voltage-current probe disposed between the combination node and the plasma electrode to measure the properties of the combined signal; and a system monitor in electrical communication with at least one branch of the device to monitor the device.

16. The device of claim 10, further comprising:

a clock having a frequency that is an integral multiple of the fundamental frequency; and a plurality of divider circuits to produce the fundamental frequency electrical signal and the supplemental signal from the signal provided by the clock, wherein the supplemental signal includes a plurality of frequencies produced by the divider circuits.

17. The device of claim 16, further comprising:

a first circuit branch with a first match network having a frequency compatible with the fundamental frequency signal, through which the fundamental frequency signal flows;

a plurality of lower frequency circuit branches, each having a respective match network, each respective match network having a frequency corresponding to that of one of the plurality of frequencies harmonic to the fundamental frequency, through which a signal having one of the plurality of frequencies flows;

phase shifters controlled by phase controllers disposed in two of the lower frequency circuit branches to control the phase of the plurality of lower frequency signals relative to the fundamental frequency electrical signal;

a combination node, disposed between respective ends of the first and second circuit branches and the plasma electrode at which the fundamental frequency signal and the supplemental signal are combined into one signal;

a voltage-current probe disposed between the combination node and the plasma electrode to measure the properties of the combined signal; and a system monitor in electrical communication with at least one branch of the device to monitor the device.

* * * * *

UNITED STATES PATENT AND TRADEMARK OFFICE
CERTIFICATE OF CORRECTION

PATENT NO. : 6,917,204 B2
DATED : July 12, 2005
INVENTOR(S) : Andrej S. Mitrovic et al.

It is certified that error appears in the above-identified patent and that said Letters Patent is hereby corrected as shown below:

Title page,
Item [56], References Cited, U.S. PATENT DOCUMENTS, insert:
-- 5,571,578A *   11-05-1996   Kaji et al.        438/789
   5,932,116A *   08-03-1999   Matsumoto et al.   219/121.57
   6,043,607A *   03-28-2000   Roderick           315/111.21 --.
Insert the following:
-- FOREIGN PATENT DOCUMENTS WO   01/62053 A2   08-23-2001
EP   0731559 A1    09-11-1996
EP   0149089 A2    07-24-1985 --.

Signed and Sealed this

Twenty-first Day of February, 2006

JON W. DUDAS
*Director of the United States Patent and Trademark Office*